(12) United States Patent
Lee

(10) Patent No.: US 11,644,486 B2
(45) Date of Patent: May 9, 2023

(54) APPARATUS FOR MONITORING POWER IN A SEMICONDUCTOR DEVICE

(71) Applicant: SK hynix Inc., Gyeonggi-do (KR)

(72) Inventor: Myung Hwan Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/399,536

(22) Filed: Aug. 11, 2021

(65) Prior Publication Data
US 2022/0317163 A1 Oct. 6, 2022

(30) Foreign Application Priority Data

Mar. 31, 2021 (KR) .................. 10-2021-0041877

(51) Int. Cl.
*G01R 19/10* (2006.01)
*G01R 19/165* (2006.01)

(52) U.S. Cl.
CPC ....... *G01R 19/10* (2013.01); *G01R 19/16576* (2013.01)

(58) Field of Classification Search
None
See application file for complete search history.

(56) References Cited

U.S. PATENT DOCUMENTS 5,479,093 A * 12/1995 Jeon ................. G05F 1/465
323/273
7,030,682 B2 4/2006 Tobita

FOREIGN PATENT DOCUMENTS

KR 10-2005-0060902 A 6/2005

* cited by examiner

*Primary Examiner* — Jas A Sanghera
(74) *Attorney, Agent, or Firm* — IP & T Group LLP

(57) ABSTRACT

A power circuit includes at least one power detector coupled to both a first power voltage input via a pin or pad and a second power voltage supplied into a component, and configured to output a sensed power voltage changed from the first power voltage in response to a drop of the second power voltage, and a comparator configured to compare the sensed power voltage with a reference voltage to output a power sensing result.

18 Claims, 7 Drawing Sheets

APPARATUS FOR MONITORING POWER IN A SEMICONDUCTOR DEVICE

CROSS-REFERENCE TO RELATED APPLICATIONS

This patent application claims the benefit to Korean Patent Application No. 10-2021-0041877, filed on Mar. 31, 2021, the entire disclosure of which is incorporated herein by reference.

TECHNICAL FIELD

Various embodiments of the present disclosure described herein relate to a semiconductor device, and particularly relate to an apparatus and method for monitoring supply power in the semiconductor device.

BACKGROUND

A semiconductor device includes a device for efficiently controlling and managing power supplied externally. The semiconductor device may include at least one regulator. The regulator may be designed to generate a constant or stable voltage and supply the constant or stable voltage to loads included in the semiconductor device. When the power supplied externally is unstable or the loads inside the semiconductor device are excessive, a voltage output from the regulator may drop or fluctuate. The semiconductor device may include a sensing circuit for checking or monitoring a voltage drop output from the regulator.

BRIEF DESCRIPTION OF THE DRAWINGS

The description herein makes reference to the accompanying drawings wherein like reference numerals refer to like parts throughout the figures.

DETAILED DESCRIPTION

Figure 1:
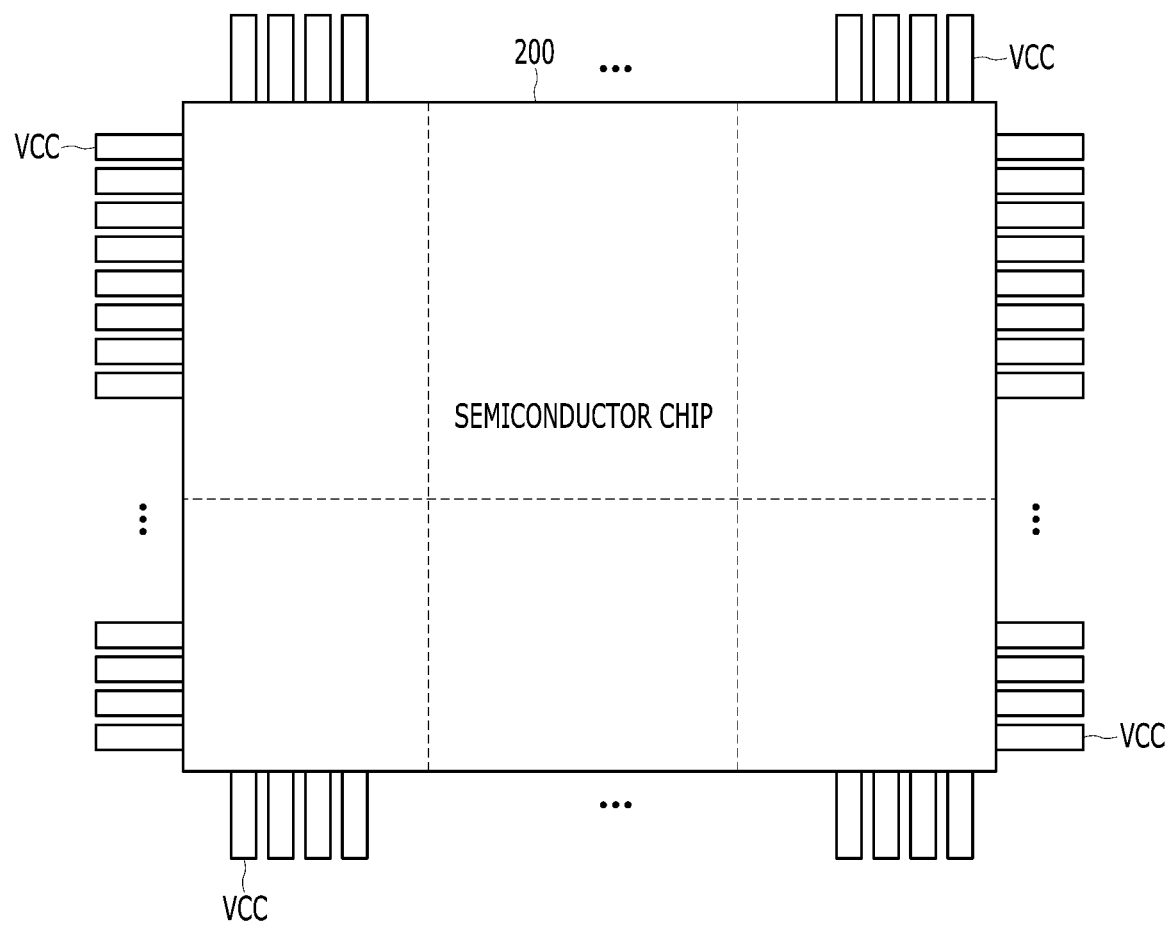
FIG. 1 illustrates a semiconductor device chip according to an embodiment of the present disclosure.

Various embodiments of the present disclosure are described below with reference to the accompanying drawings. Elements and features of the disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components (e.g., an interface unit, circuitry, etc.).

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational (e.g., is not turned on nor activated). The block/unit/circuit/component used with the "configured to" language includes hardware—for example, circuits, memory storing program instructions executable to implement the operation, etc. Additionally, "configured to" can include a generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that implement or perform one or more tasks.

As used in the disclosure, the term 'circuitry' or 'logic' refers to all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions) and (c) circuits, such as a microprocessor(s) or a portion of a microprocessor(s), that require software or firmware for operation, even if the software or firmware is not physically present. This definition of 'circuitry' or 'logic' applies to all uses of this term in this application, including in any claims. As a further example, as used in this application, the term "circuitry" or "logic" also covers an implementation of merely a processor (or multiple processors) or a portion of a processor and its (or their) accompanying software and/or firmware. The term "circuitry" or "logic" also covers, for example, and if applicable to a particular claim element, an integrated circuit for a storage device.

As used herein, the terms "first," "second," "third," and so on are used as labels for nouns that they precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. For example, the phrase "determine A based on B." While in this case, B is a factor that affects the determination of A, such a phrase does not foreclose the determination of A from also being based on C. In other instances, A may be determined based solely on B.

Herein, an item of data, a data item, a data entry or an entry of data may be a sequence of bits. For example, the data item may include the contents of a file, a portion of the file, a page in memory, an object in an object-oriented program, a digital message, a digital scanned image, a part of a video or audio signal, metadata or any other entity which can be represented by a sequence of bits. According to an embodiment, the data item may include a discrete object. According to another embodiment, the data item may include a unit of information within a transmission packet between two different components.

An embodiment of the present disclosure can provide an apparatus and method capable of efficiently managing power inside a semiconductor device.

The apparatus according to an embodiment of the present disclosure can quickly detect a drop of power voltage, which may occur when the power supplied to the semiconductor device is unstable or an electrical load is excessive due to an internal operation or an internal structure. Further, another embodiment can provide an apparatus and method capable of detecting a location or area in which the drop of power voltage has occurred in the semiconductor device.

When the power is supplied through a plurality of pins or pads included in a semiconductor device chip, a plurality of sensing circuits capable of sensing a power voltage may be disposed for each corresponding pin or pad. The plurality of sensing circuits is coupled to both a first power voltage supplied from an outside of the semiconductor device chip and a second power voltage used in an internal circuit of the semiconductor device chip. When a drop occurs in the second power voltage, the first power voltage can be adjusted or changed. A comparison circuit may compare a change of the first power voltage with a reference voltage to output a comparison result.

According to an embodiment, the comparison circuit may be selectively connected to one of the plurality of sensing circuits. The comparison circuit can reduce a noise, which may be caused by a parasitic capacitance or the like, in a process of transferring the change of the first power voltage output from each of the plurality of sensing circuits. In addition, the sensing circuit can recognize a drop of the second power voltage by checking or monitoring the first power voltage supplied through a pin or pad, instead of checking or monitoring the second power voltage directly supplied to the loads in the semiconductor device chip. Further, a process for checking or monitoring the second power voltage might not affect a level of the second power voltage, so that the process can avoid an influence on the second power voltage.

In addition, according to an embodiment, the second power voltage used in another location may be selectively connected to a specific location where the second power voltage is dropped, in order to compensate for a drop of the second power voltage.

In an embodiment, a power circuit can include at least one power detector coupled to a first power voltage input via a pin or pad and a second power voltage supplied into a component, and configured to output a sensed power voltage changed from the first power voltage in response to a drop of the second power voltage; and a comparator configured to compare the sensed power voltage with a reference voltage to output a power sensing result.

The at least one power detector can include a first element configured to receive the first power voltage, output the second power voltage, and maintain a difference between the first power voltage and the second power voltage below a preset value.

The first element can be turned on when the difference between the first power voltage and the second power voltage is equal to or greater than the preset value and turned off when the difference is less than the preset value.

The first element can include a diode including an anode coupled to the sensed power voltage and a cathode coupled to the second power voltage.

The at least one power detector can include a second element configured to selectively transfer the first power voltage; a third element configured to maintain a level of the first power voltage transferred by the second element; and a fourth element configured to transfer the sensed power voltage, maintained or changed by the first and third elements, to the comparator in response to a sensing signal.

The sensing signal can be input to the at least one power detector and the comparator. The comparator can output the power sensing result while the sensing signal is activated.

The at least one power detector can include N power detectors, and the sensing signal can include plural sensing signals. The plural sensing signals are individually input to the N power detectors. The comparator can be configured to output the power sensing result when one of the plural sensing signals is activated.

The power circuit can further include at least one switch configured to couple each of the N power detectors to the comparator.

In another embodiment, a semiconductor device can include plural pines or pads coupled to a first power voltage input from an external device; a power circuit coupled to the plural pins or pads and configured to output a second power voltage; and plural internal circuits coupled to the power circuit and configured to use the second power voltage to store or process a data item. The power circuit can include plural power detectors individually coupled to one of the plural pines or pads and individually configured to output a sensed power voltage changed from the first power voltage in response to a drop of the second power voltage; and a comparator configured to compare the sensed power voltage, output from one of the plural power detectors, with a reference voltage to output a power sensing result.

The power circuit can further include a low drop-out (LDO) regulator configured to receive the first power voltage and output the second power voltage having the lowest input/output voltage difference capable of stabilizing an operation performed by the plural internal circuits.

The power circuit can further include plural switches configured to couple each of the plural power detectors to the comparator.

Each of the plural power detectors can include a first element configured to receive the first power voltage, output the second power voltage, and maintain a difference between the first power voltage and the second power voltage below a preset value.

The first element can be turned on when the difference between the first power voltage and the second power voltage is equal to or greater than the preset value and turned off when the difference is less than the preset value.

The first element can include a diode including an anode coupled to the sensed power voltage and a cathode coupled to the second power voltage.

Each of the plural power detectors can include a second element configured to selectively transfer the first power voltage; a third element configured to maintain a level of the first power voltage transferred by the second element; and a fourth element configured to transfer the sensed power voltage, maintained or changed by the first and third elements, to the comparator in response to a sensing signal.

Each of plural sensing signals can be input to each of the plural power detectors and the comparator. While one of the plural sensing signals is activated, the comparator can output the power sensing result corresponding to the activated sensing signal.

When one of the plural sensing signals is activated, the comparator is configured to compare the sensed power voltage, output from one of the plural power detectors in response to the activated sensing signal, with a reference voltage to output the power sensing result.

In another embodiment, a power sensing circuit which is coupled to a first power voltage input from an external device via plural pins or pads and a second power voltage supplied to an internal circuit, and configured to, when a change of the second power voltage occurs, compare the first power voltage, which is changed based on the change of the second power voltage, with a reference voltage to output a power sensing result. The power sensing circuit can detect the change of the second power voltage without affecting a level of the second power voltage.

The power sensing circuit can include a diode including an anode coupled to the first power voltage and a cathode coupled to the second power voltage, the diode configured to maintain a difference between the first power voltage and the second power voltage below a preset value.

The diode can be turned on when the difference between the first power voltage and the second power voltage is equal to or greater than the preset value and turned off when the difference is less than the preset value.

In an embodiment, a semiconductor circuit can include a power circuit suitable for generating an internal power voltage from an external power voltage; and a load circuit suitable for operating based on the internal power voltage, the operating causing fluctuation of the internal power voltage. The power circuit can include a diode having an anode initially precharged to a level of the external power voltage and a cathode coupled to the internal power voltage, and suitable for sensing the level on the anode, the level changing due to the internal power voltage; and a comparator suitable for comparing the sensed level with a reference level to generate a result of the comparing.

Embodiments of the present disclosure will now be described with reference to the accompanying drawings, wherein like numbers reference like elements.

FIG. 1 illustrates a semiconductor device chip according to an embodiment of the present disclosure.

Referring to FIG. 1, a semiconductor device chip 200 can include electrical elements and circuits to perform a specific function. The semiconductor device chip 200 can include a plurality of pins or pads, and can receive or output a power voltage, a data item, a command, or various control signals through the plurality of pins or pads. The circuits or electrical elements included in the semiconductor device chip 200 may vary depending on a design purpose, and the number of a plurality of pins or pads included in the semiconductor device chip may also vary depending on a design.

The plurality of pins or pads may be used according to a preset function or purpose. For example, when a specific pin or pad among the plurality of pins or pads is set to be used for data input/output, an electrical signal corresponding to the data item (e.g., a waveform or a potential within a specific voltage range) is transmitted to the corresponding pin or pad. Also, when a power voltage is supplied to a specific pin or pad, the specific pin or pad may be used to receive a power voltage used for operation of internal components included in the semiconductor device chip.

A semiconductor device such as a memory system or a processor which satisfies a user's needs has been developed to operate at a higher speed and consume less power. The semiconductor device chip 200 can include plural circuits or modules to perform various functions. When a plurality of circuits, modules, or components that perform a plurality of functions are formed in plural different semiconductor chips, delay and noise may occur in the process of transferring data and signals between circuits, modules or components of the plural different semiconductor chips, so that operation performance of the memory system or the processor may be degraded. Recently, the semiconductor device chip 200 can be designed to include various circuits, modules, or components, thereby improving performance of the semiconductor device and increasing an integration degree of the semiconductor device.

As a plurality of circuits, modules, or components are included in the single semiconductor device chip 200, a change of electrical loads inside the semiconductor device chip 200 may increase. Referring to FIG. 1, a power voltage VCC may be supplied through a plurality of pins or pads included in the semiconductor device chip to operate the plurality of circuits, modules, or components included in the semiconductor device chip 200. Including an additional circuit for distributing and managing power in the semiconductor device chip 200 rather than a circuit, module, or component for performing an operation of the semiconductor device may be an obstacle to increase the integration degree of the semiconductor device. Accordingly, in order to supply the power voltage to the plurality of circuits, modules or components in the semiconductor device chip 200, the power voltage VCC can be received through a plurality of pins or pads instead of a single pin or pad.

According to an embodiment, a plurality of pins or pads for receiving the power voltage VCC may be dispersedly arranged in different locations of the semiconductor device chip 200. When the semiconductor device chip 200 is divided into a plurality of regions (dotted lines), at least one pin or pad for receiving the power voltage VCC may be disposed in each region of the semiconductor device chip 200.

When the power voltage VCC is supplied through a plurality of pins or pads to supply power to the plurality of circuits, modules, or components, it might be difficult to detect where a power issue occurs in the semiconductor device chip 200. In order to detect whether internal power voltages for driving the plurality of circuits, modules or components become unstable, it might be practically difficult to individually check or monitor the internal power voltages supplied to each of the plurality of circuits, modules or components. Particularly, an internal power voltage can be unstable due to an increase or decrease of electrical loads while operations are performed by the plurality of circuits, modules, or components. For example, due to an excessive increase in the load, a drop of the internal power voltage may occur. The drop of the power voltage supplied to at least some of the plurality of circuits, modules, or components may cause an unexpected error in the semiconductor device or seriously affect operating performance of the semiconductor device.

A semiconductor device according to an embodiment of the present disclosure may include an apparatus capable of efficiently detecting a drop of a power voltage supplied into a plurality of circuits, modules, or components. In addition, even when the power voltage VCC can be input through a plurality of pins or pads and supplied to a plurality of circuits, modules, or components, the apparatus such as a power circuit can check or monitor a change or a drop of the power voltage at a specific position or a specific part of the semiconductor device and output a checking or monitoring result. Further, based on information regarding an operation internally performed within the semiconductor device and the checking or monitoring result of detecting the change or the drop of the power voltage, the apparatus can determine which operation performed within the semiconductor device may cause instability of the power voltage and/or where a specific operation is performed within the semiconductor device. Even if the drop of the power voltage occurs at a specific location or part of the semiconductor device, the apparatus can use the power voltage supplied at another location or part of the semiconductor device to compensate for the drop of the power voltage at the specific location or part.

The apparatus such as the power circuit according to an embodiment may be applicable to a non-volatile memory device or a memory system including a non-volatile memory device. Also, according to another embodiment, the power circuit may be applicable to a volatile memory device or a memory system including the volatile memory device. The power circuit may also be applicable to a processor, a system IC, or the like which is designed for a specific purpose. Hereinafter, referring to FIGS. 1 and 2, a memory system implemented in a semiconductor device chip including a power circuit according to an embodiment will be described.

Figure 2:
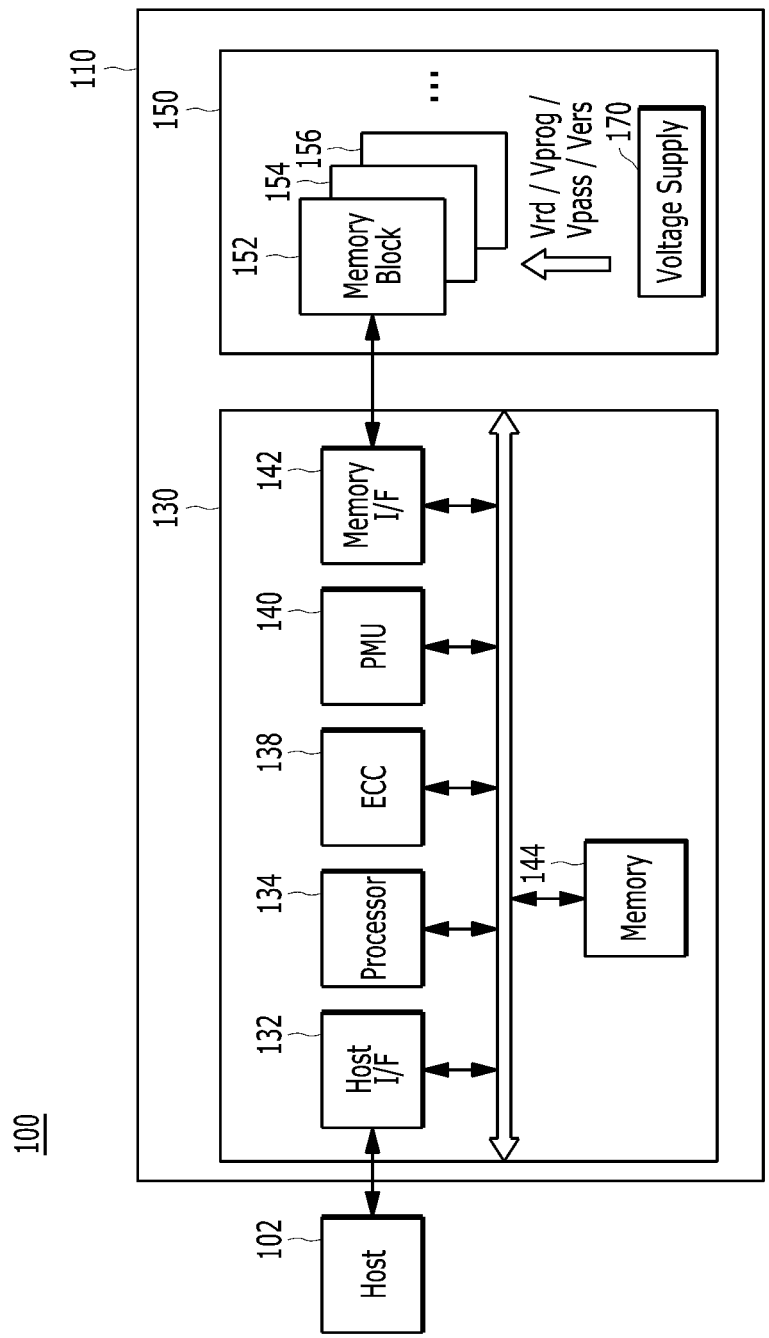
FIG. 2 illustrates a data processing system according to an embodiment of the present disclosure.

FIG. 2 illustrates a data processing system according to an embodiment of the present disclosure.

Referring to FIG. 2, the data processing system 100 may include a host 102 engaged or coupled with a memory system, such as memory system 110. For example, the host 102 and the memory system 110 can be coupled to each other via a data bus, a host cable and the like to perform data communication.

The memory system 110 may include a memory device 150 and a controller 130. The memory device 150 and the controller 130 in the memory system 110 may be considered components or elements physically separated from each other. The memory device 150 and the controller 130 may be connected via at least one data path. For example, the data path may include a channel and/or a way.

According to an embodiment, the memory device 150 and the controller 130 may be components or elements functionally divided. Further, according to an embodiment, the memory device 150 and the controller 130 may be implemented with a single semiconductor device chip 200 shown in FIG. 1 or a plurality of semiconductor device chips. According to an embodiment, when the memory system 110 may be required to have a higher integration degree, the memory device 150 and the controller 130 may be included in the single semiconductor device chip 200. The controller 130 may perform a data input/output operation in response to a request input from the external device. For example, when the controller 130 performs a read operation in response to a read request input from an external device, data stored in a plurality of non-volatile memory cells included in the memory device 150 is transferred to the controller 130.

As shown in FIG. 2, the memory device 150 may include a plurality of memory blocks 152, 154, 156. The memory block 152, 154, 156 may be understood as a group of non-volatile memory cells in which data is removed together by a single erase operation. Although not illustrated, the memory block 152, 154, 156 may include a page which is a group of non-volatile memory cells that store data together during a single program operation or output data together during a single read operation. For example, one memory block may include a plurality of pages.

For example, the memory device 150 may include a plurality of memory planes or a plurality of memory dies. According to an embodiment, the memory plane may be considered a logical or a physical partition including at least one memory block, a driving circuit capable of controlling an array including a plurality of non-volatile memory cells, and a buffer that can temporarily store data inputted to, or outputted from, non-volatile memory cells.

In addition, according to an embodiment, the memory die may include at least one memory plane. The memory die may be understood as a set of components implemented on a physically distinguishable substrate. Each memory die may be connected to the controller 130 through a data path. Each memory die may include an interface to exchange an item of data and a signal with the controller 130.

According to an embodiment, the memory device 150 may include at least one memory block 152, 154, 156, at least one memory plane, or at least one memory die. The internal configuration of the memory device 150 shown in FIG. 2 may be different according to performance of the memory system 110. An embodiment of the present disclosure is not limited to the internal configuration shown in FIG. 2.

Referring to FIG. 2, the memory device 150 may include a voltage supply circuit 170 capable of supplying at least some voltage into the memory block 152, 154, 156. The voltage supply circuit 170 may supply a read voltage Vrd, a program voltage Vprog, a pass voltage Vpass, or an erase voltage Vers into a non-volatile memory cell included in the memory block. For example, during a read operation for reading data stored in the non-volatile memory cell included in the memory block 152, 154, 156, the voltage supply circuit 170 may supply the read voltage Vrd into a selected non-volatile memory cell. During the program operation for storing data in the non-volatile memory cell included in the memory block 152, 154, 156, the voltage supply circuit 170 may supply the program voltage Vprog into a selected non-volatile memory cell. Also, during a read operation or a program operation performed on the selected nonvolatile memory cell, the voltage supply circuit 170 may supply a pass voltage Vpass into a non-selected nonvolatile memory cell. During the erasing operation for erasing data stored in the non-volatile memory cell included in the memory block 152, 154, 156, the voltage supply circuit 170 may supply the erase voltage Vers into the memory block.

The memory device 150 may store information regarding various voltages which are supplied to the memory block 152, 154, 156 based on which operation is performed. For example, when a non-volatile memory cell in the memory block 152, 154, 156 can store multi-bit data, plural levels of the read voltage Vrd for recognizing or reading the multi-bit data item may be required. The memory device 150 may include a table including information corresponding to plural levels of the read voltage Vrd, corresponding to the multi-bit data item. For example, the table can include bias values stored in a register, each bias value corresponding to a specific level of the read voltage Vrd. The number of bias values for the read voltage Vrd that is used for a read operation may be limited to a preset range. Also, the bias values can be quantized.

Figure 3:
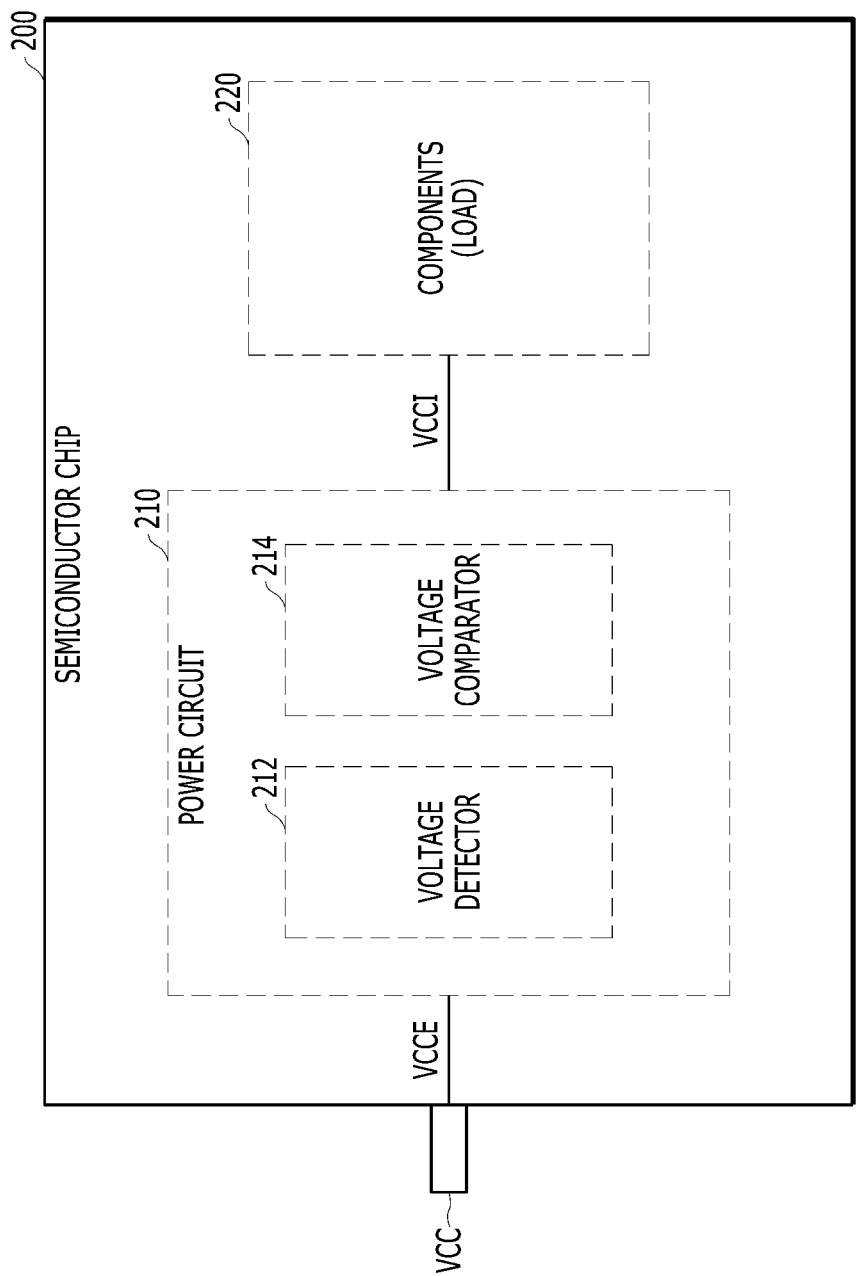
FIG. 3 illustrates a semiconductor device chip according to another embodiment of the present disclosure.

The voltage supply circuit 170 in the memory device 150 can generate plural voltages having various levels based on the power supply voltage VCC. In this operation, an amount of electrical load may be increased or decreased. For example, when a high-level voltage such as the program voltage Vprog is repeatedly generated and used in the memory device 150, an electrical load may rapidly increase so that a temporary drop of the power voltage VCC may occur. Referring to FIG. 3, the power circuit 210 in the semiconductor device chip 200 may detect a drop of the power voltage VCC and output a detection result to the controller 130.

The host 102 may include a portable electronic device (e.g., a mobile phone, an MP3 player, a laptop computer, etc.) or a non-portable electronic device (e.g., a desktop computer, a game player, a television, a projector, etc.).

The host 102 may also include at least one operating system (OS), which can control functions and operations performed in the host 102. The OS can provide interoperability between the host 102 engaged operatively with the memory system 110 and a user who intends to store data in the memory system 110. The OS may support functions and operations corresponding to a user's requests. By way of example but not limitation, the OS can be classified into a general operating system and a mobile operating system according to mobility of the host 102. The general operating system may be split into a personal operating system and an enterprise operating system according to system requirements or a user environment. As compared with the personal operating system, the enterprise operating systems can be specialized for securing and supporting high performance computing.

The mobile operating system may be subject to support services or functions for mobility (e.g., a power saving function). The host 102 may include a plurality of operating systems. The host 102 may execute multiple operating systems interlocked with the memory system 110, corresponding to a user's request. The host 102 may transmit a plurality of commands corresponding to the user's requests into the memory system 110, thereby performing operations corresponding to the plurality of commands within the memory system 110.

A controller 130 in the memory system 110 may control a memory device 150 in response to a request or a command input from the host 102. For example, the controller 130 may perform a read operation to provide data read from the memory device 150 to the host 102 and may perform a write operation (or a program operation) to store data input from the host 102 in the memory device 150. In order to perform data input/output (I/O) operations, the controller 130 may control and manage internal operations of reading data, programming data, erasing data, or the like.

According to an embodiment, the controller 130 may include a host interface 132, a processor 134, error correction circuitry (ECC) 138, a power management unit (PMU) 140, a memory interface 142, and a memory 144. Components included in the controller 130 as illustrated in FIG. 2 may vary according to structures, functions, operation performance, or the like, regarding the memory system 110.

For example, the memory system 110 may be implemented with any of various types of storage devices, which may be electrically coupled with the host 102, according to a protocol of a host interface. Non-limiting examples of suitable storage devices include a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and the like. Components may be added to or omitted from the controller 130 according to an implementation of the memory system 110.

The host 102 and the memory system 110 each may include a controller or an interface for transmitting and receiving signals, data, and the like, in accordance with one or more predetermined protocols. For example, the host interface 132 in the memory system 110 may include an apparatus capable of transmitting signals, data, and the like to the host 102 or receiving signals, data, and the like from the host 102.

The host interface 132 included in the controller 130 may receive signals, commands (or requests), and/or data input from the host 102. For example, the host 102 and the memory system 110 may use a predetermined protocol to transmit and receive data therebetween. Examples of a set of rules or procedures for data communication or interfaces supported by the host 102 and the memory system 110 for sending and receiving data include Universal Serial Bus (USB), Multi-Media Card (MMC), Parallel Advanced Technology Attachment (PATA), Small Computer System Interface (SCSI), Enhanced Small Disk Interface (ESDI), Integrated Drive Electronics (IDE), Peripheral Component Interconnect Express (PCIe or PCI-e), Serial-attached SCSI (SAS), Serial Advanced Technology Attachment (SATA), Mobile Industry Processor Interface (MIPI), and the like. According to an embodiment, the host interface 132 is a type of layer for exchanging data with the host 102 and is implemented with, or driven by, firmware called a host interface layer (HIL).

The Integrated Drive Electronics (IDE) or Advanced Technology Attachment (ATA) may be used as one of the interfaces for transmitting and receiving data and, for example, may use a cable including 40 wires connected in parallel to support data transmission and data reception between the host 102 and the memory system 110. When a plurality of memory systems 110 are connected to a single host 102, the plurality of memory systems 110 may be divided into a master and a slave by using a position or a dip switch to which the plurality of memory systems 110 are connected. The memory system 110 set as the master may be used as a main memory device. The IDE (ATA) may include, for example, Fast-ATA, ATAPI, or Enhanced IDE (EIDE).

A Serial Advanced Technology Attachment (SATA) interface is a type of serial data communication interface that is compatible with various ATA standards of parallel data communication interfaces which are used by Integrated Drive Electronics (IDE) devices. The 40 wires in the IDE interface can be reduced to six wires in the SATA interface. For example, 40 parallel signals for the IDE can be converted into 6 serial signals for the SATA interface. The SATA interface has been widely used because of its faster data transmission and reception rate, and its less resource consumption in the host 102 used for the data transmission and reception. The SATA interface may connect up to 30 external devices to a single transceiver included in the host 102. In addition, the SATA interface can support hot plugging that allows an external device to be attached to or detached from the host 102, even while data communication between the host 102 and another device is being executed. Thus, the memory system 110 can be connected or disconnected as an additional device, like a device supported by a universal serial bus (USB) even when the host 102 is powered on. For example, in the host 102 having an eSATA port, the memory system 110 may be freely attached to or detached from the host 102 like an external hard disk.

Small Computer System Interface (SCSI) is a type of serial data communication interface used for connecting a computer or a server with other peripheral devices. The SCSI can provide a high transmission speed, as compared with other interfaces such as IDE and SATA. In the SCSI, the host 102 and at least one peripheral device (e.g., memory system 110) are connected in series, but data transmission and reception between the host 102 and each peripheral device may be performed through a parallel data communication. In the SCSI, it is easy to connect or disconnect a device such as the memory system 110 to or from the host 102. The SCSI can support connections of 15 other devices to a single transceiver included in host 102.

Serial Attached SCSI (SAS) can be understood as a serial data communication version of the SCSI. In the SAS, the host 102 and a plurality of peripheral devices are connected in series, and data transmission and reception between the host 102 and each peripheral device may be performed in a serial data communication scheme. The SAS can support connection between the host 102 and the peripheral device through a serial cable instead of a parallel cable, to easily manage equipment using the SAS and enhance or improve operational reliability and communication performance. The SAS may support connections of eight external devices to a single transceiver included in the host 102.

The Non-volatile memory express (NVMe) is a type of interface based at least on a Peripheral Component Interconnect Express (PCIe) designed to increase performance and design flexibility of the host 102, servers, computing devices, and the like equipped with the non-volatile memory system 110. The PCIe can use a slot or a specific cable for connecting a computing device (e.g., host 102) and a peripheral device (e.g., memory system 110). For example, the PCIe can use a plurality of pins (e.g., 18 pins, 32 pins, 49 pins, or 82 pins) and at least one wire (e.g., x1, x4, x8, or x16) to achieve high speed data communication over several hundred MB per second (e.g., 250 MB/s, 500 MB/s, 984.6250 MB/s, or 1969 MB/s). According to an embodiment, the PCIe scheme may achieve bandwidths of tens to hundreds of Giga bits per second. The NVMe can support an operation speed of the non-volatile memory system 110, such as an SSD, that is faster than a hard disk.

According to an embodiment, the host 102 and the memory system 110 may be connected through a universal serial bus (USB). The Universal Serial Bus (USB) is a type of scalable, hot-pluggable plug-and-play serial interface that can provide cost-effective standard connectivity between the host 102 and peripheral devices such as a keyboard, a mouse, a joystick, a printer, a scanner, a storage device, a modem, a video camera, and the like. A plurality of peripheral devices such as the memory system 110 may be coupled to a single transceiver included in the host 102.

Referring to FIG. 2, the error correction circuitry 138 can correct error bits of data read from the memory device 150, and may include an error correction code (ECC) encoder and an ECC decoder. The ECC encoder may perform error correction encoding of data to be programmed in the memory device 150 to generate encoded data into which a parity bit is added, and store the encoded data in memory device 150. The ECC decoder can detect and correct error bits contained in the data read from the memory device 150 when the controller 130 reads the data stored in the memory device 150. For example, after performing error correction decoding on the data read from the memory device 150, the error correction circuitry 138 determines whether the error correction decoding has succeeded or not, and outputs an instruction signal (e.g., a correction success signal or a correction fail signal), based on a result of the error correction decoding. The error correction circuitry 138 may use a parity bit, which has been generated during the ECC encoding process for the data stored in the memory device 150, in order to correct the error bits of the read data. When the number of the error bits is greater than or equal to the number of correctable error bits, the error correction circuitry 138 may not correct the error bits and instead may output the correction fail signal indicating failure in correcting the error bits.

According to an embodiment, the error correction circuitry 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), or the like. The error correction circuitry 138 may include all circuits, modules, systems, and/or devices for performing the error correction operation based on at least one of the above described codes.

For example, the ECC decoder may perform hard decision decoding or soft decision decoding on data transmitted from the memory device 150. The hard decision decoding can be understood as one of two methods broadly classified for error correction. The hard decision decoding may include an operation of correcting an error bit by reading digital data of '0' or '1' from a non-volatile memory cell in the memory device 150. Because the hard decision decoding handles a binary logic signal, the circuit/algorithm design or configuration may be simpler and a processing speed may be faster than the soft decision decoding.

The soft decision decoding may quantize a threshold voltage of a non-volatile memory cell in the memory device 150 by two or more quantized values (e.g., multiple bit data, approximate values, an analog value, and the like) in order to correct an error bit based on the two or more quantized values. The controller 130 can receive two or more alphabets or quantized values from a plurality of non-volatile memory cells in the memory device 150, and then performs a decoding based on information generated by characterizing the quantized values as a combination of information such as conditional probability or likelihood.

According to an embodiment, the ECC decoder may use low-density parity-check and generator matrix (LDPC-GM) code among methods designed for the soft decision decoding. The low-density parity-check (LDPC) code uses an algorithm that can read values of data from the memory device 150 in several bits according to reliability, not simply data of 1 or 0 like the hard decision decoding, and iteratively repeats it through a message exchange in order to improve reliability of the values. Then, the values are finally determined as data of 1 or 0. For example, a decoding algorithm using LDPC codes can be understood as probabilistic decoding. The hard decision decoding in which a value output from a non-volatile memory cell is coded as 0 or 1. Compared to the hard decision decoding, the soft decision decoding can determine the value stored in the non-volatile memory cell based on the stochastic information. Regarding bit-flipping (which may be considered an error that can occur in the memory device 150), the soft decision decoding may provide improved probability of correcting the error and recovering data, as well as providing reliability and stability of corrected data. The LDPC-GM code may have a scheme in which internal LDGM codes can be concatenated in series with high-speed LDPC codes.

According to an embodiment, the ECC decoder may use, for example, low-density parity-check convolutional codes (LDPC-CCs) for the soft decision decoding. The LDPC-CCs may have a scheme using a linear time encoding and a pipeline decoding based on a variable block length and a shift register.

According to an embodiment, the ECC decoder may use, for example, a Log Likelihood Ratio Turbo Code (LLR-TC) for the soft decision decoding. A Log Likelihood Ratio (LLR) may be calculated as a non-linear function for a distance between a sampled value and an ideal value. In addition, a Turbo Code (TC) may include a simple code (for example, a Hamming code) in two or three dimensions and repeat decoding in a row direction and a column direction to improve the reliability of values.

The power management unit (PMU) 140 may control electrical power provided to the controller 130. The PMU 140 may monitor the electrical power supplied to the memory system 110 (e.g., a voltage supplied to the controller 130) and provide the electrical power to components included in the controller 130. The PMU 140 may not only detect power-on or power-off, but also generate a trigger signal to enable the memory system 110 to urgently back up a current state when the electrical power supplied to the memory system 110 is unstable. According to an embodiment, the PMU 140 may include a device or a component capable of accumulating electrical power that may be used in an emergency.

According to an embodiment, the PMU 140 may receive the detection result about the drop of the power supply voltage from the power circuit 210 included in the semiconductor device chip described with reference to FIGS. 1 and 4. The PMU 140 may check a safety of operations performed in the memory system 110, in response to the detection result. In addition, according to an embodiment, the PMU 140 may temporarily stop an operation of the memory system 110 in response to the detection result, or may cause an operation to be performed again when safety or integrity of the operation is suspected.

The memory interface 142 may serve as an interface for handling commands and data transferred between the controller 130 and the memory device 150, in order to allow the controller 130 to control the memory device 150 in response to a command or a request input from the host 102. The memory interface 142 may generate a control signal for the memory device 150 and may process data input to, or output from, the memory device 150 under the control of the processor 134 in a case when the memory device 150 is a flash memory.

For example, when the memory device 150 includes a NAND flash memory, the memory interface 142 includes a NAND flash controller (NFC). The memory interface 142 can provide an interface for handling commands and data between the controller 130 and the memory device 150. In accordance with an embodiment, the memory interface 142 can be implemented through, or driven by, firmware called a Flash Interface Layer (FIL) for exchanging data with the memory device 150.

According to an embodiment, the memory interface 142 may support an open NAND flash interface (ONFi), a toggle mode, or the like, for data input/output with the memory device 150. For example, the ONFi may use a data path (e.g., a channel, a way, etc.) that includes at least one signal line capable of supporting bi-directional transmission and reception in a unit of 8-bit or 16-bit data. Data communication between the controller 130 and the memory device 150 can be achieved through at least one interface regarding an asynchronous single data rate (SDR), a synchronous double data rate (DDR), a toggle double data rate (DDR), or the like.

The memory 144 may be used as a working memory of the memory system 110 or the controller 130, while temporarily storing transactional data of operations performed in the memory system 110 and the controller 130. For example, the memory 144 may temporarily store read data output from the memory device 150 in response to a read request from the host 102 before the read data is output to the host 102. In addition, the controller 130 may temporarily store write data input from the host 102 in the memory 144 before programming the write data in the memory device 150. When the controller 130 controls operations, such as a data read operation, a data write or program operation, a data erase operation, etc., of the memory device 150, data transmitted between the controller 130 and the memory device 150 of the memory system 110 may be temporarily stored in the memory 144.

In addition to the read data or write data, the memory 144 may store information (e.g., map data, read requests, program requests, etc.) used for inputting or outputting data between the host 102 and the memory device 150. According to an embodiment, the memory 144 may include one or more of a command queue, a program memory, a data memory, a write buffer/cache, a read buffer/cache, a data buffer/cache, a map buffer/cache, and so on. The controller 130 may allocate some storage space in the memory 144 for a component which is established to carry out a data input/output operation. For example, the write buffer established in the memory 144 may be used to temporarily store target data subject to a program operation.

In an embodiment, the memory 144 may be implemented with a volatile memory. For example, the memory 144 may be implemented with a static random access memory (SRAM), a dynamic random access memory (DRAM), or both. Although FIG. 2 illustrates, for example, the memory 144 disposed within the controller 130, embodiments are not limited thereto. The memory 144 may be located within or external to the controller 130. For instance, the memory 144 may be embodied by an external volatile memory having a memory interface transferring data and/or signals between the memory 144 and the controller 130.

The processor 134 may control the overall operations of the memory system 110. For example, the processor 134 can control a program operation or a read operation of the memory device 150 in response to a write request or a read request entered from the host 102. According to an embodiment, the processor 134 may execute firmware to control the program operation or the read operation in the memory system 110. Herein, the firmware may be referred to as a flash translation layer (FTL). An example of the FTL will be described in detail, referring to FIGS. 3 and 4. According to an embodiment, the processor 134 may be implemented with a microprocessor, a central processing unit (CPU), or the like.

According to an embodiment, the memory system 110 may be implemented with at least one multi-core processor. The multi-core processor is a type of circuit or chip in which two or more cores, which are considered distinct processing regions, are integrated. For example, when a plurality of cores in the multi-core processor drive or execute a plurality of flash translation layers (FTLs) independently, a data input/output speed (or performance) of the memory system 110 may be improved. According to an embodiment, the data input/output (I/O) operations in the memory system 110 may be independently performed through different cores in the multi-core processor.

The processor 134 in the controller 130 may perform an operation corresponding to a request or a command input from the host 102. Further, the memory system 110 may perform an operation independent from a command or a request input from the host 102. In one case, an operation performed by the controller 130 in response to the request or the command input from the host 102 may be considered a foreground operation, while an operation performed by the controller 130 independently from the request or the command input from the host 102 may be considered a background operation. The controller 130 can perform foreground or background operations for reading, writing, or erasing data in the memory device 150. In addition, a parameter set operation corresponding to a set parameter command or a set feature command as a set command transmitted from the host 102 may be considered a foreground operation. As a background operation that is performed without a command transmitted from the host 102, the controller 130 can perform garbage collection (GC), wear leveling (WL), bad block management for identifying and processing bad blocks, or the like.

According an embodiment, substantially similar operations may be performed as both the foreground operation and the background operation. For example, when the memory system 110 performs garbage collection in response to a request or a command input from the host 102 (e.g., Manual GC), the garbage collection can be considered a foreground operation. When the memory system 110 performs garbage collection independently of the host 102 (e.g., Auto GC), the garbage collection can be considered a background operation.

When the memory device 150 includes a plurality of dies (or a plurality of chips) each including a plurality of non-volatile memory cells, the controller 130 may perform a parallel processing regarding plural requests or commands input from the host 102 in order to improve performance of the memory system 110. For example, the transmitted requests or commands may be divided into plural groups including at least some of a plurality of planes, a plurality of dies, or a plurality of chips included in the memory device 150, and the plural groups of requests or commands are processed individually or in parallel in each plane, each die or each chip.

The memory interface 142 in the controller 130 may be connected to the plurality of dies or chips in the memory device 150 through at least one channel and at least one way. When the controller 130 distributes and stores data in the plurality of dies through each channel or each way in response to requests or commands associated with a plurality of pages including non-volatile memory cells, a plurality of operations corresponding to the requests or the commands can be performed simultaneously or in parallel in the plurality of dies or planes. Such a processing method or scheme can be considered as an interleaving method. Because a data input/output speed of the memory system 110 increases by operating with the interleaving method, data I/O performance of the memory system 110 can be improved.

By way of example but not limitation, the controller 130 can recognize statuses of a plurality of channels (or ways) associated with the plurality of dies included in the memory device 150. The controller 130 may determine a status of each channel or each way as one of a busy status, a ready status, an active status, an idle status, a normal status, and an abnormal status. The determination of which channel or way an instruction (and/or a data) is delivered through by the controller can be associated with a physical block address. The controller 130 may refer to descriptors delivered from the memory device 150. The descriptors may include a block or page of parameters describing something about the memory device 150. The descriptors can have a predetermined format or structure. For instance, the descriptors may include device descriptors, configuration descriptors, unit descriptors, and the like. The controller 130 may refer to, or use, the descriptors to determine which channel(s) or way(s) is used to exchange an instruction or data.

Referring to FIG. 2, the memory device 150 in the memory system 110 may include a plurality of memory blocks 152, 154, 156. Each of the plurality of memory blocks 152, 154, 156 includes a plurality of non-volatile memory cells. According to an embodiment, the memory block 152, 154, 156 can be a group of non-volatile memory cells erased together. The memory block 152, 154, 156 may include a plurality of pages which is a group of non-volatile memory cells read or programmed together.

In one embodiment, each memory block 152, 154, or 156 may have a three-dimensional stack structure for a high integration. Further, the memory device 150 may include a plurality of dies, each die including a plurality of planes, each plane including the plurality of memory blocks 152, 154, 156. A configuration of the memory device 150 may be changed depending on performance of the memory system 110.

FIG. 2 illustrates the memory device 150 that includes the plurality of memory blocks 152, 154, and 156. The plurality of memory blocks 152, 154, and 156 may be any of single-level cell (SLC) memory blocks, multi-level cell (MLC) memory blocks, or the like, according to the number of bits that can be stored in one memory cell. An SLC memory block includes a plurality of pages implemented by memory cells, each memory cell storing one bit of data. An SLC memory block may have higher data I/O operation performance and higher durability than the MLC memory block. The MLC memory block includes a plurality of pages implemented by memory cells, each memory cell storing multi-bit data (e.g., two or more bits of data). The MLC memory block may have larger storage capacity for the same space compared to the SLC memory block. The MLC memory block can be highly integrated in a view of storage capacity.

In an embodiment, the memory device 150 may be implemented with MLC memory blocks such as a double level cell (DLC) memory block, a triple-level cell (TLC) memory block, a quadruple-level cell (QLC) memory block, and a combination thereof. The DLC memory block may include a plurality of pages implemented by memory cells, each memory cell capable of storing 2-bit data. The TLC memory block can include a plurality of pages implemented by memory cells, each memory cell capable of storing 3-bit data. The QLC memory block can include a plurality of pages implemented by memory cells, each memory cell capable of storing 4-bit data. In another embodiment, the memory device 150 can be implemented with a block including a plurality of pages implemented by memory cells, each memory cell capable of storing five or more bits of data.

According to an embodiment, the controller 130 may use a MLC memory block included in the memory device 150 as an SLC memory block that stores one-bit data in one memory cell. A data input/output speed of the multi-level cell (MLC) memory block can be slower than that of the SLC memory block. That is, when the MLC memory block is used as the SLC memory block, a margin for a read or program operation can be reduced. For example, the controller 130 may perform a data input/output operation with a higher speed when the MLC memory block is used as the SLC memory block. Thus, the controller 130 may use the MLC memory block as a SLC buffer to temporarily store data because the buffer may require a high data input/output speed for improving performance of the memory system 110.

Further, according to an embodiment, the controller 130 can program data in a MLC a plurality of times without performing an erase operation on a specific MLC memory block included in the memory device 150. In general, non-volatile memory cells do not support data overwrite. However, the controller 130 may program 1-bit data in the MLC a plurality of times using a feature in which the MLC is capable of storing multi-bit data. For a MLC overwrite operation, the controller 130 may store the number of program times as separate operation information when 1-bit data is programmed in a MLC. According to an embodiment, an operation for uniformly levelling threshold voltages of the MLCs may be carried out before another 1-bit data is programmed in the same MLCs, each having stored another-bit data.

In an embodiment, the memory device 150 is embodied as a non-volatile memory such as a flash memory, for example, as a NAND flash memory, a NOR flash memory, or the like. In another embodiment, the memory device 150 may be implemented by at least one of a phase change random access memory (PCRAM), a ferroelectrics random access memory (FRAM), a transfer torque random access memory (SU-RAM), and a spin transfer torque magnetic random access memory (STT-MRAM), or the like.

FIG. 3 illustrates a semiconductor device chip according to another embodiment of the present disclosure.

Referring to FIG. 3, a semiconductor device chip 200 can include a pin or pad which a power voltage VCC is input through, a power circuit 210 configured to generate an internal power voltage VCCI based on an external power voltage VCCE transmitted through the pin or pad, and a component 220 driven by the internal power voltage VCCI. Herein, the external power voltage VCCE is a power voltage which is input through a pin or pad from an external device, while the internal power voltage VCCI is applied to the component 220. The external power voltage VCCE and the internal power voltage VCCI are electrically coupled to each other, and a power circuit or any element (e.g., a conversion or switching element) can be generally arranged between the external power voltage VCCE and the internal power voltage VCCI.

According to an embodiment, the component 220 shown in FIG. 3 can include the memory blocks 152, 154, 156 and the voltage supply circuit 170 described in FIG. 2. Electrical loads of the component 220 can vary based on operations performed through the memory blocks 152, 154, 156 and the voltage supply circuit 170. According to another embodiment, the component 220 can include at least some modules or circuits in the controller 130 shown in FIG. 2.

According to an embodiment, the power circuit 210 can include a voltage regulator 212 and a voltage sensor 214. The voltage regulator 212 can be used to supply stable power to an electronic device such as the memory system 110. Generally, the voltage regulator 212 may be classified into a linear regulator and a switching regulator. An example of the switching regulator can be a DC-DC converter. Although the DC-DC converter can have high conversion efficiency, the output voltage of the DC-DC converter may include a lot of noise compared to that of the linear regulator. An example of a linear regulator can be a low-dropout (LDO) regulator. The LDO regulator may have low conversion efficiency. But, the LDO regulator can have a fast response speed. In addition, the output voltage of the LDO regulator can include a smaller amount of noise compared to that of the DC-DC converter. Generally, the LDO regulator can be applicable to a noise-sensitive device or a device which should be driven with high performance. For example, the LDO regulator, which can compensate for the disadvantages of the DC-DC converter, can be applicable to the memory system 110 operating at a high speed. The voltage regulator 212 can output the internal power voltage VCCI based on the external power voltage VCCE.

The voltage sensor 214 may detect a change or a drop of the internal power voltage VCCI. As shown in FIG. 1, due to an operation performed by the component 220, the internal power voltage VCCI can fluctuate at different locations and regions in the semiconductor device chip 200 (e.g., a voltage drop phenomenon occurs). For example, as a chip size increases, a length of the power rail and a resistance of the power line may increase. When a large amount of current is consumed at the same time due to the operation of the component 220, a drop of the internal voltage VCCI may occur. Because a voltage drop of the power line directly affects a processing speed of a transistor gate, performance of the semiconductor device such as the memory system 110 or the memory device 150 may be deteriorated.

When the voltage sensor 214 directly senses a level of the internal power voltage VCCI to detect the drop of the internal power voltage VCCI, an electrical load or burden on supplying the internal power voltage VCCI may increase. When the voltage sensor 214 can increase the electrical load, the drop of the internal power voltage VCCI could be deteriorated (e.g., be greater or longer). The deteriorated drop of the internal power voltage VCCI may adversely affect performance of the semiconductor device. Accordingly, the voltage sensor 214 according to an embodiment can detect the drop of the internal power voltage VCCI based on a sensed power voltage VCCE_S which is an external power voltage fluctuating in response to the drop of the internal power voltage VCCI to output a detected result, which will be described hereinafter.

Figure 4:
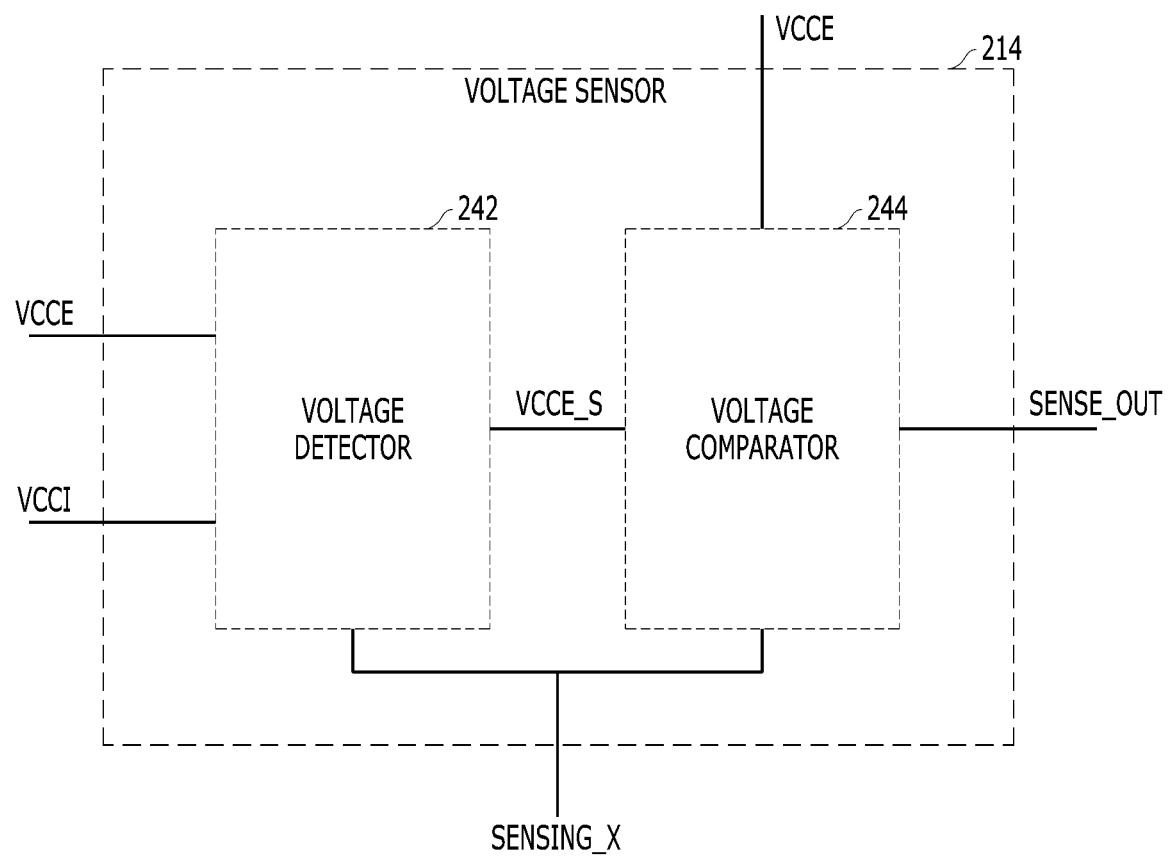
FIG. 4 illustrates a voltage sensor according to an embodiment of the present disclosure.

FIG. 4 illustrates a voltage sensor according to an embodiment of the present disclosure.

Referring to FIG. 4, the voltage sensor 214 can include a voltage detector 242 and a voltage comparator 244. The voltage sensor 214 is coupled to an external power voltage VCCE and an internal power voltage VCCI. The voltage sensor 214 may output a detection result SENSE_OUT related to a drop of the internal power voltage VCCI. The voltage detector 242 and the voltage comparator 244 can be controlled by a sensing signal SENSING_X.

Referring to FIG. 4, a power voltage VCC may be supplied to the semiconductor device chip 200 through a plurality of pins or pads. According to an embodiment, the voltage sensor 214 can include a plurality of voltage detectors 242, each voltage detector is coupled to the internal power voltage VCCI and the external power voltage VCCE corresponding to the power voltage VCC supplied through the plurality of pins or pads. According to an embodiment, although the voltage sensor 214 includes the plurality of voltage detectors 242, a single comparator 244 may be included in the voltage sensor 214.

The sensing signal SENSING_X can control the voltage detector 242 and the voltage comparator 244. When a different sensing signal SENSING_X is input and activated to one of the plurality of voltage detectors 242, the corresponding sensing signal SENSING_X may be input to the comparator 244. As the voltage detector 242 and the voltage comparator 244 operate in response to the sensing signal SENSING_X, a region or position can be recognized based on the sensing signal SENSING_X, which is input to one of voltage detectors 242 corresponding to each of the plurality of pins or pads to which the power voltage VCC is applied to the semiconductor device chip 220. Accordingly, a change of the internal power voltage VCCI supplied at a specific region or position corresponding to the sensing signal SENSING_X may be selectively detected.

The voltage detector 242 is coupled to the external power voltage VCCE and the internal power voltage VCCI. However, the voltage detector 242 can induce a change of the sensed power voltage VCCE_S in response to a change of the internal power voltage VCCI. The voltage detector 242 can output, to the voltage comparator 244, the sensed power voltage VCCE_S, which is changed from the external power voltage VCCE according to the change of the internal power voltage VCCI. If the voltage detector 242 detects a drop of the internal power voltage VCCI and outputs the internal power voltage VCCI to the comparator 244 for comparing the internal power voltage VCCI with a reference voltage, an electrical load using the internal power voltage VCCI could be increased. The increased electrical load may adversely affect the change of the internal power voltage VCCI. Accordingly, the voltage detector 242 may include an element for maintaining a preset voltage difference between the internal power voltage VCCI and the external power voltage VCCE. For example, the element included in the voltage detector 242 can induce a change of the sensed power voltage VCCE_S when a difference between the internal power voltage VCCI and the external power voltage VCCE are greater than a preset value. The element can maintain a constant level of the sensed power voltage VCCE_S without fluctuation when the difference between the internal power voltage VCCI and the external power voltage VCCE is less than the preset value. Through these operations, the voltage detector 242 may output, to the voltage comparator 244, the sensed power voltage VCCE_S, which may be changed according to the change of the internal power voltage VCCI.

In order not to increase the electrical load on the internal power voltage VCCI, the voltage comparator 244 may recognize a change in the internal power voltage VCCI based on the external power voltage VCCE and the sensed power voltage VCCE_S. The voltage sensor 214 does not directly detect or sense a level of the internal power voltage VCCI. That is, the voltage sensor 214 can check the change of the sensed power voltage VCCE_S to detect or recognize a change or drop of the internal power voltage VCCI. For example, the voltage comparator 244 is coupled to the sensed power voltage VCCE_S of which level can be changed according to a change of the internal power voltage VCCI and coupled to the external power voltage VCCE input via a plurality of pins or pads to generate a reference voltage. The voltage comparator 244 can generate the reference voltage from the external power voltage VCCE input via the plurality of pins or pads and compare the reference voltage with the sensed power voltage VCCE_S changed according to a change of the internal power voltage VCCI. The voltage comparator 244 may output the detection result SENSE_OUT for showing whether the internal power voltage VCCI becomes lower than a preset reference voltage due to a change or drop of the internal power voltage VCCI.

Figure 5:
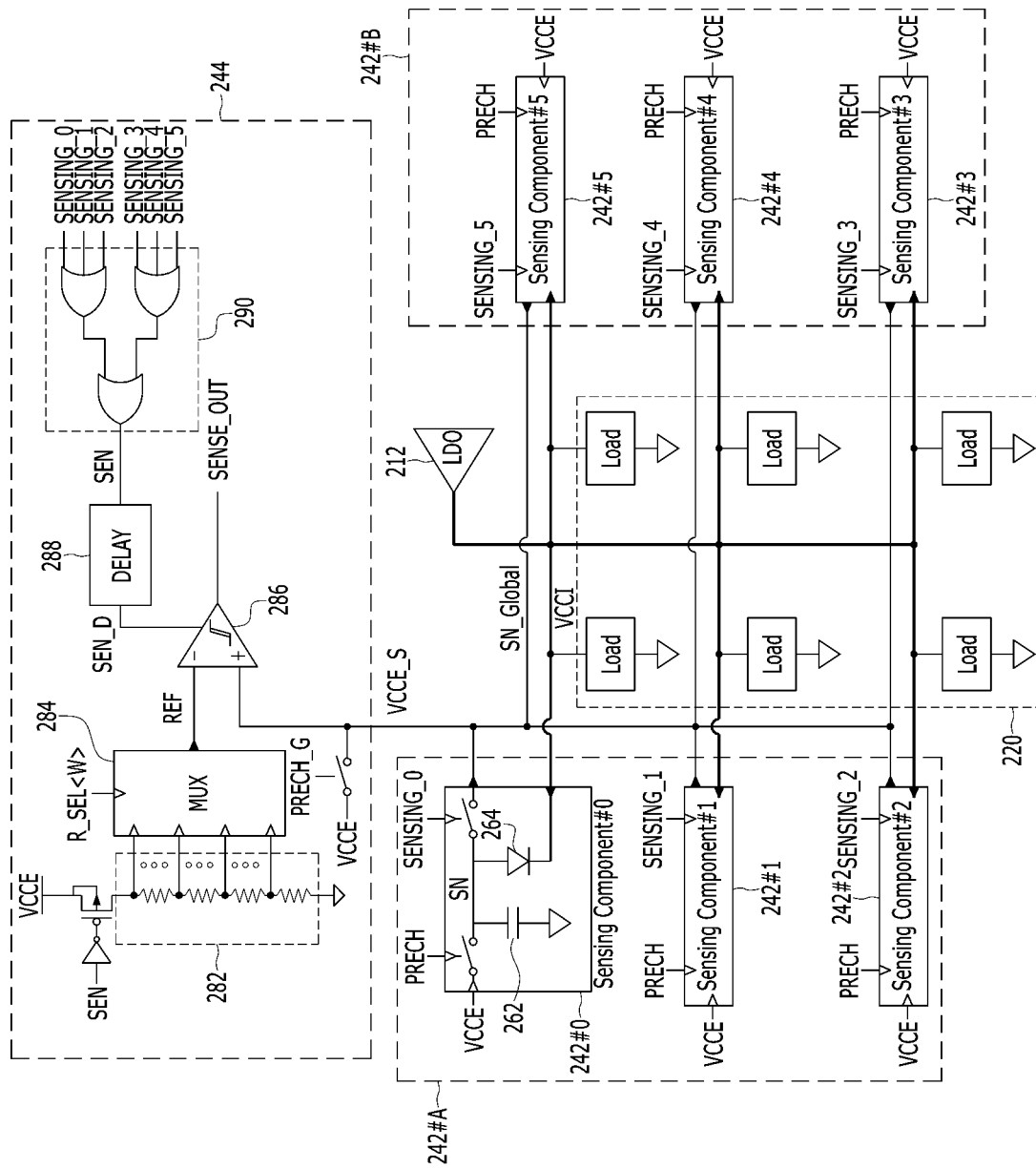
FIG. 5 illustrates a power circuit according to an embodiment of the present disclosure.

FIG. 5 illustrates a power circuit according to an embodiment of the present disclosure. Specifically, FIG. 5 describes the power circuit 210 and the component 220 included in the semiconductor device chip 200 shown in FIG. 3.

Referring to FIG. 5, the internal power voltage VCCI output from the voltage regulator 212 included in the power circuit 210 may be supplied to the component 220. The component 220 may include a plurality of circuits or a plurality of modules for performing specific functions or operations.

The power voltage VCC can be supplied to the semiconductor device chip 200 through six pins or pads. In response to the six pins or pads, the voltage sensor 214 in the power circuit 210 may include six voltage sensing components 242#0 to 242#5 and a single voltage comparator 244. For example, the six voltage sensing components 242#0 to 242#5 may be disposed in a peripheral area such as two regions 242#A, 242#B of the semiconductor device chip 200. According to an embodiment, each of the six voltage sensing components 242#0 to 242#5 may be arranged adjacent to each of the six pins or pads on the semiconductor device chip 200.

A first voltage sensing component 242#0 may include a diode 264 having an anode which is coupled to the external power voltage VCCE and a cathode which is coupled to the internal power voltage VCCI. The diode 264 is turned on when a difference between the external power voltage VCCE and the internal power voltage VCCI is equal to or greater than a threshold voltage, so that a level of the internal power voltage VCCI may increase based on the external power voltage VCCE. When the external power voltage VCCE and the internal power voltage VCCI have a smaller difference than the threshold voltage, the diode 264 is turned off, so that the external power voltage VCCE and the internal power voltage VCCI may be electrically cut off. According to an embodiment, the diode 264 can be replaced with a diode-connected NMOS or PMOS transistor that binds a gate and a drain together. Through the diode 264, the first voltage sensing component 242#0 may generate the sensed power voltage VCCE_S described with reference to FIG. 4.

The anode of the diode 264 is connected to a sensing node SN, and the external power voltage VCCE may be precharged to the sensing node SN. In order to precharge the external power voltage VCCE to the sensing node SN, the first voltage sensing component 242#0 can include a precharge switch for selectively supplying the external power voltage VCCE transmitted through the pin or pad to the sensing node SN, and a capacitor 262 for maintaining a level of the external power voltage VCCE transferred to the sensing node SN. Herein, the precharge switch may be controlled by a precharge signal PRECH. When the precharge signal PRECH is activated, the precharge switch is turned on and the external power voltage VCCE transmitted through a pin or pad may be supplied to the sensing node SN.

The first voltage sensing component 242#0 may include a sensing switch that transfers the external power voltage VCCE precharged in the sensing node SN to the comparator 244 in response to a first sensing signal SENSING_0. The sensing switch turned on by the first sensing signal SENSING_0 may transfer the external power voltage VCCE maintained at the sensing node SN to the comparator 244. The external power voltage VCCE maintained at sensing node SN can fluctuate, when a level of the internal power voltage VCCI becomes lower (i.e., be dropped) so that a difference between the external power voltage VCCE and the internal power voltage VCCI is greater than the threshold voltage. In response to the first sensing signal SENSING_0, the sensing switch can transfer the fluctuated external power voltage (e.g., the sensed power voltage VCCE_S shown in FIG. 4) to the voltage comparator 244. When there is no drop of the internal power voltage VCCI, the external power voltage VCCE precharged and maintained at the sensing node SN might not be changed so that the maintained external power voltage can be transferred to the voltage comparator 244 through the sensing switch.

The power circuit 210 may include six voltage sensing components 242#0 to 242#5, and plural sensing signals SENSING_0 to SENSING_5 can be individually input to each of the six voltage sensing components 242#0 to 242#5. The six voltage sensing components 242#0 to 242#5 and the comparator 244 may be coupled through a global sensing node SN_Global. One of the six voltage sensing components 242#0 to 242#5 may transmit the external power voltage VCCE to the comparator 244, and the comparator 244 may receive the reference voltage and the transferred external power voltage VCCE, compare the reference voltage with the transferred external power voltage VCCE to output the detection result SENSE_OUT as a comparison result.

The voltage comparator 244 may include a comparator 286 that compares a reference voltage REF and the external power voltage VCCE transmitted from one of the six voltage sensing components 242#0 to 242#5. The comparator 286 may output the detection result SENSE_OUT. When the external power voltage VCCE is not transmitted from the six voltage sensing components 242#0 to 242#5, the global sensing node SN_Global connected to the comparator 286 is precharged in response to a global precharge signal PRECH_G. The voltage comparator 244 may generate a plurality of voltage levels through a resistor group 282 including a plurality of resistors connected in series, based on the external power voltage VCCE transmitted through the pin or pad. Further, the voltage comparator 244 may include a multiplexer 284 that selects one of a plurality of voltage levels generated by the resistor group 282 and outputs the selected one as the reference voltage REF. A selection signal R_SEL<W> for selecting one from the plurality of voltage levels may be input to the multiplexer 284.

The comparator 286 may be controlled by a sensing driving signal SEN_D. A driving signal SEN is generated by a logic circuit 290 for performing an OR operation on the plural sensing signals SENSING_0 to SENSING_5 which individually correspond to each of the six voltage sensing components 242#0 to 242#5. Also, the comparator 244 may include a delay unit 288 that delays the driving signal SEN by a preset time to generate the sensing driving signal SEN_D. According to an embodiment, the delay time of the delay unit 288 is determined based on a distance between the six voltage sensing components 242#0 to 242#5 and the comparator 244 disposed on the semiconductor device chip 200. The delay time can also be determined based on a time spent on transferring the external power voltage VCCE from the six voltage sensing components 242#0 to 242#5. Through the logic circuit 290 and the delay unit 288 in the comparator 244, the plural sensing signals SENSING_0 to SENSING_5 corresponding to each of the six voltage sensing components 242#0 to 242#5 can be utilized to generate the sensing driving signal SEN_D for controlling an operation margin of the comparator 286.

The power circuit 210 according to an embodiment of the present disclosure can utilize the external power voltage VCCE that is changed in response to the drop to the internal power voltage VCCI and control operation margin of the six voltage sensing components 242#0 to 242#5 and the comparator 244, so that an electrical load or burden occurring in the operation of outputting the detection result SENSE_OUT can be reduced.

Figure 6:
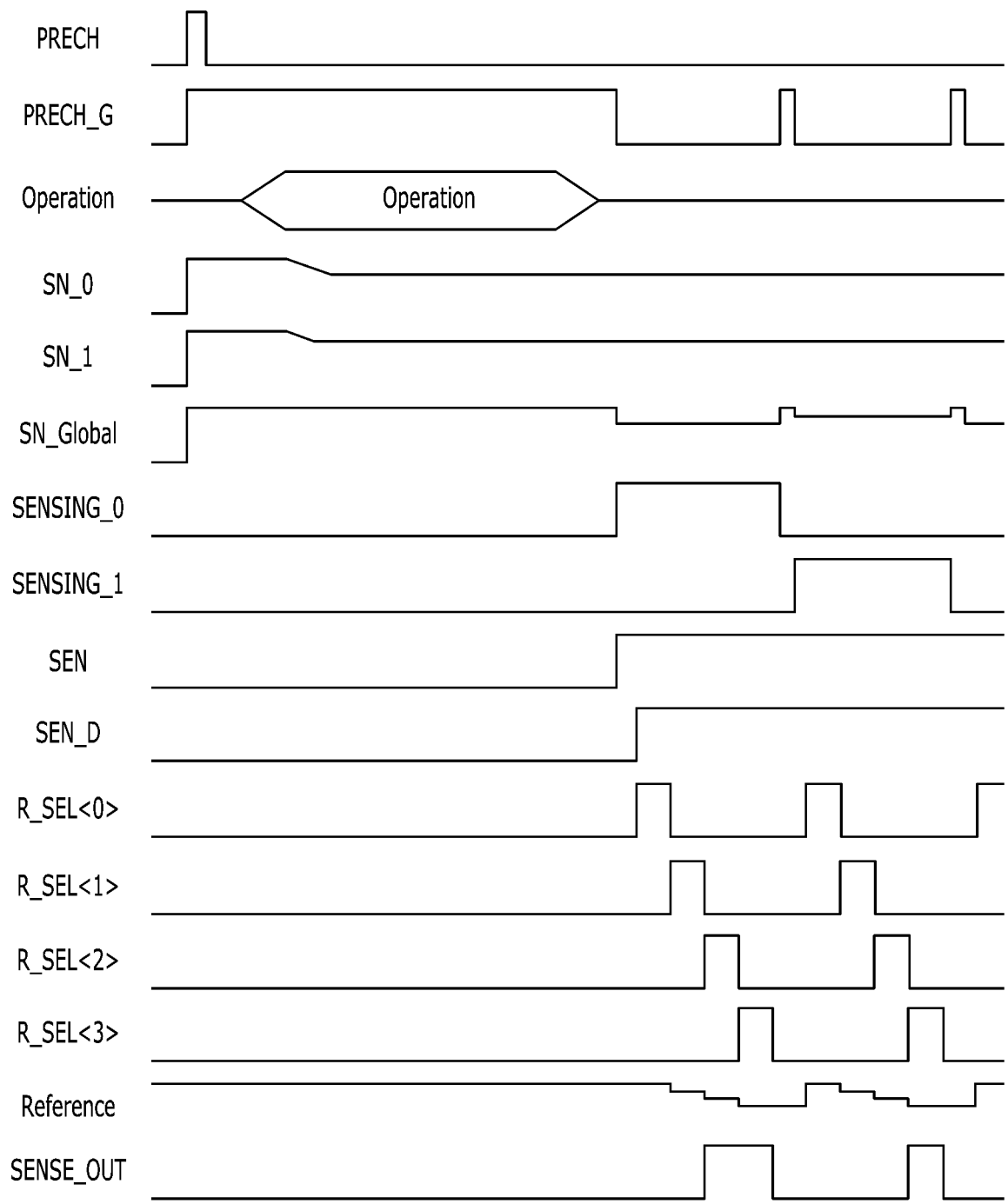
FIG. 6 illustrates an operation of the power circuit shown in FIG. 5 according to an embodiment of the present disclosure.

FIG. 6 illustrates an operation of the power circuit shown in FIG. 5 according to an embodiment of the present disclosure. Specifically, FIG. 6 describes an operation performed by the voltage sensor 214 included in the power circuit 210.

Referring to FIG. 6, the precharge signal PRECH can be activated before the components 220 in the semiconductor device chip 200 perform their operations corresponding to an external command or a preset task, etc. When the precharge signal PRECH is activated, the external power voltage VCCE may be precharged at the sensing node SN in the six voltage sensing components 242#0 to 242#5. While the components 220 in the semiconductor device chip 200 perform operations in response to an external command or a preset task, the global precharge signal PRECH_G may be activated to precharge a global sensing node SN_Global coupled to the comparator 286 with the external power voltage VCCE.

An electrical load occurs while the components 220 in the semiconductor device chip 200 perform an operation or a preset task in response to an external command. When the electrical load is excessively increased, the internal power voltage VCCI can drop or fluctuate. For example, in FIG. 6, a level of the external power voltage VCCE precharged at the sensing nodes SN_0, SN_1 in the first sensing component 242#0 and the second sensing component 242#1 is changed (or dropped) due to an increase in the electrical load during a specific operation.

First, when the first sensing signal SENSING_0 input to the first sensing components 242#0 is activated, the second sensing signal SENSING_1 input to the second sensing component 242#1 can be maintained in an inactive state. Further, when the first sensing signal SENSING_0 is activated, the global precharge signal PRECH_G is deactivated.

Referring to FIG. 5, in response to activation of the first sensing signal SENSING_0, a level of the external power voltage VCCE at the sensing node SN_0 in the first sensing component 242#0 is changed in response to a drop of the internal power voltage VCCI, so that a potential of the global sensing node SN_Global can be lowered.

In addition, in response to the activation of the first sensing signal SENSING_0, the driving signal SEN can be activated by the logic circuit 290 in the comparator 244. The driving signal SEN passes through the delay unit 288 so that the sensing driving signal SEN_D is activated.

The comparator 244 sequentially activates the selection signals R_SEL<0:3> and inputs the activated selection signals R_SEL<0:3> to the comparator 286. The comparator 286 can sequentially compare different levels of reference voltages REF with a changed potential at the global sensing node SN_Global (e.g., the sensed power voltage VCCE_S shown in FIG. 4). The comparator 286 can compare the changed potential of the global sensing node SN_Global with plural reference voltages having different levels to output the detection result SENSE_OUT. Accordingly, the comparator 244 can output how much a level or a potential of the global sensing node SN_Global has changed or dropped.

For example, referring to FIG. 6, it may be determined that a level of the external power voltage VCCE changed in response to a drop of the internal power voltage VCCI at the sensing node SN_0 in the first sensing component 242#0 (e.g., the sensed power voltage VCCE_S shown in FIG. 4) is less than two of the four different levels of reference voltages REF and greater than the other two of the four different levels. An activated period (or pulse width) of the detection result SENSE_OUT may vary according to a result of comparing the external power voltage VCCE transferred from the first sensing component 242#0 (e.g., the sensed power voltage VCCE_S shown in FIG. 4) with the reference voltages REF having four different levels.

On the other hand, after checking a level change of the external power voltage VCCE at the sensing node SN_0 in the first sensing component 242#0, the first sensing signal SENSING_0 is deactivated. Then, the second sensing signal SENSING_1 can be activated. When the second sensing signal SENSING_1 is activated, a level of the external power voltage VCCE at the sensing node SN_1 in the second sensing component 242#1 can be changed in response to a drop of the internal power voltage VCCI, so that a potential of the global sensing node SN_Global can be lowered.

In response to the activation of the second sensing signal SENSING_1, the voltage comparator 244 may re-perform an operation performed according to the activation of the first sensing signal SENSING_0. Referring to FIG. 6, it may be determined that a level of the external power voltage VCCE changed in response to the drop of the internal power voltage VCCI at the sensing node SN_1 in the second sensing component 242#1 is less than one of the reference voltages REF having four different levels and greater than the other three of the reference voltages REF.

As described above, when the components 220 in the semiconductor device chip 200 perform an operation capable of performing an operation or a preset task based on an external command, an amount of the electrical load may vary according to an area or location of the semiconductor device chip 200. Also, depending on the amount of the electrical load based on the area or location, there is a difference in how much a level of the internal power voltage VCCI is dropped or changed. Referring to FIG. 6, the first sensing component 242#0 and the second sensing component 242#1 arranged in different locations can be determined whether the internal power voltage VCCI has dropped or changed in the corresponding region or location. In addition, it is possible to determine how much a level of the internal power voltage VCCI is dropped or changed based on the plurality of reference voltages REF having different levels generated by the voltage comparator 244. The power circuit 210 can determine which location or region and how much a level of the internal power voltage VCCI is changed or dropped due to the electrical load occurring when the components 220 in the semiconductor device chip 200 operate. In addition, the power circuit 210 can monitor what type of operations performed by the components 220 in the semiconductor device chip 200 causes a drop or change of the internal power voltage VCCI. The power circuit 210 can recognize or estimate which location or region and how much a level of the internal power voltage VCCI is changed or dropped based on an operation performed by the components 220.

Figure 7:
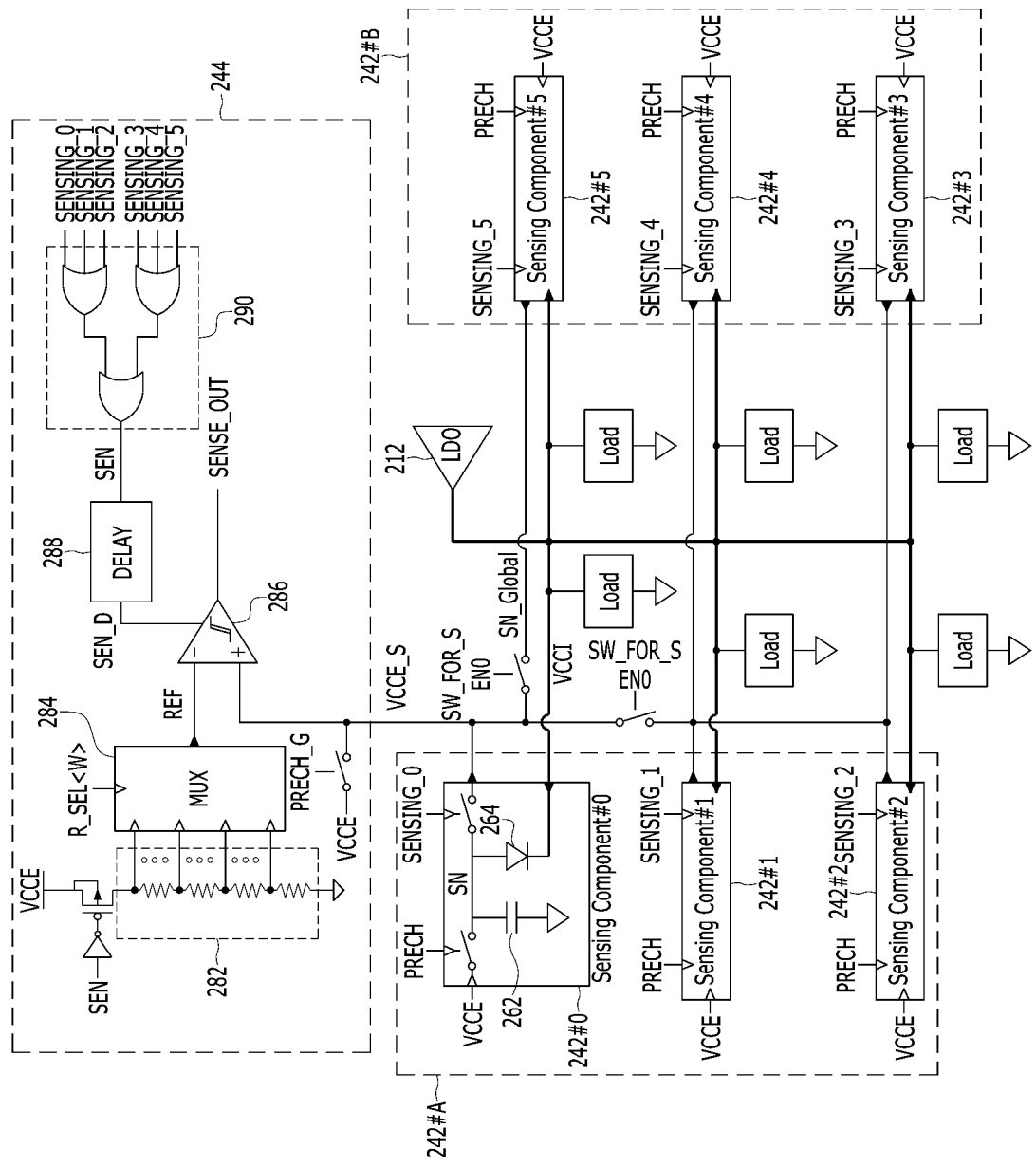
FIG. 7 illustrates a power circuit according to another embodiment of the present disclosure.

FIG. 7 illustrates a power circuit according to another embodiment of the present disclosure. Herein, the description may focus on a difference between the power circuits described with reference to FIGS. 5 and 7.

Referring to FIG. 7, a plurality of switches can be added to the global sensing node SN_Global. Referring to FIGS. 5 and 7, six sensing components 242#0 to 242#5 are connected to the single voltage comparator 244. When the six sensing components 242#0 to 242#5 are arranged in different locations of the semiconductor device chip 200, the global sensing node SN_Global may be a very long line (e.g., wire). In this case, a resistance, capacitance, or electrical load generated in the global sensing node SN_Global may be larger as a length of the line increases. The resistance, capacitance, or electrical load generated in the global sensing node SN_Global might degrade performance of the voltage sensor 214. When one of the six sensing components 242#0 to 242#5 outputs the sensed power voltage VCCE_S to the voltage comparator 244, the other sensing components do not output the sensed power voltage VCCE_S to the voltage comparator 244. When one of the six sensing components 242#0 to 242#5 outputs the sensed power voltage VCCE_S, a line (wiring) connected to the other sensing components may be blocked or cut off by the plurality of switches. The plurality of switches can couple only one of the six sensing components 242#0 to 242#5 to the voltage comparator 244, but a length of the line or wire corresponding to the global sensing node SN_Global can be reduced or shortened. For example, while the first sensing component 242#0 among the six sensing components 242#0 to 242#5 outputs a level of the sensed power voltage VCCE_S to the voltage comparator 244, the power circuit 210 can control a first switch control signal SW_FOR_SEN0. The global sensing node SN_Global connected to the second to sixth sensing components 242#1 to 242#5 may be electrically cut off.

In FIG. 7, two switches controlled by the first switch control signal SW_FOR_SEN0 for the first sensing component 242#0 are illustrated, but a plurality of switches may be further included based on an arrangement of the power circuit 210 in the semiconductor device chip 200. The plurality of switches can be selectively turned on or off by a plurality of switch control signals, corresponding to which one of the six sensing components 242#0 to 242#5 outputs a level of the sensed power voltage VCCE_S to the voltage comparator 244.

The resistor group 282 and the multiplexer 284 included in the voltage comparator 244 can be designed in various ways. Although a plurality of resistors in the resistor group 282 shown in FIGS. 5 and 7 is connected in series, various reference voltage levels may be obtained by connecting MOS transistors having a same or different threshold voltages in series or in parallel. In addition, even though one of the plurality of reference voltage levels is not selected by the multiplexer 284, the power circuit 210 changes or controls a bulk bias of the MOS transistor included in the resistor group 282 to change a threshold voltage of the MOS transistor, so that a voltage level output at the same position can be adjusted or changed. Further, according to another embodiment, the resistor group 282 and the comparator 286 can be implemented in a circuit or logic including an analog-to-digital converter (ADC).

In response to the plural sensing signals SENSING_0 to SENSING_5 in the voltage sensor 214, the sensed power voltage VCCE_S is transferred from the sensing node SN of the six sensing components 242#0 to 242#5 to the global sensing node SN_Global. The sensed power voltage VCCE_S on the sensing node SN and the global sensing node SN_Global have been precharged with the external power voltage VCCE. Then, the sensed power voltage VCCE_S at the sensing node SN can be dropped or changed in response to a drop of the internal power voltage VCCI, and the plural sensing signals SENSING_0 to SENSING_5 can allow transfer of the sensed power voltage VCCE_S having a level changed at the sensing node SN to the global sensing node SN_Global precharged with the external power voltage VCCE. This transmission of the changed external power voltage can occur through charge sharing, so that a subtle or minute change might be difficult to convey from the sensing node SN to the global sensing node SN_Global. According to an embodiment, in order to more easily transfer a subtle or minute change between the sensing node SN and the global sensing node SN_Global, capacitance of the sensing node SN is designed to be greater than capacitance of the global sensing node SN_Global. For example, if the capacitance of the sensing node SN is designed to be about 100 times greater than the capacitance of the global sensing node SN_Global, a subtle or minute change could be easily transferred from the sensing node SN to the global sensing node SN_Global. When the capacitance of the sensing node SN is excessively large, a level change of the sensed power voltage VCCE_S at the sensing node SN might not occur in response to a drop of the internal power voltage VCCI. In this case, in order to sufficiently induce a level change of the sensed power voltage VCCE_S at the sensing node SN in response to the drop of the internal power voltage VCCI, the operation of each voltage detector (or each sensing component) 242 can be repeatedly performed several times to several tens of times.

As described above, in the power circuit 210 according to an embodiment of the present disclosure, a plurality of sensing components can be disposed on the semiconductor device chip 200, so that the power circuit 210 can recognize or determine where or how much a level of the internal power voltage VCCI is changed or dropped in the semiconductor device chip 200.

A semiconductor device according to an embodiment of the present disclosure can efficiently recognize where a power voltage drops in a chip of the semiconductor device. When a drop of the power voltage occurs at a specific location, the power voltage supplied to another region can be used to compensate the power voltage dropped at the specific location.

In addition, because the semiconductor device according to an embodiment of the present disclosure can specify a time point and a location for monitoring or compensating a drop of the power voltage, unnecessary overheads for a process of detecting the drop of the power voltage inside the semiconductor device can be reduced.

While the present teachings have been illustrated and described with respect to the specific embodiments, it will be apparent to those skilled in the art in light of the present disclosure that various changes and modifications may be made without departing from the spirit and scope of the disclosure as defined in the following claims. Furthermore, the embodiments may be combined to form additional embodiments.

What is claimed is:

1. A power circuit, comprising:
   at least one power detector coupled to a first power voltage input via a pin or pad and a second power voltage supplied into a component, and configured to output a sensed power voltage changed from the first power voltage in response to a drop of the second power voltage; and
   a comparator configured to compare the sensed power voltage with a reference voltage to output a power sensing result,
   wherein the at least one power detector comprises a first element configured to receive the first power voltage, output the second power voltage, and maintain a difference between the first power voltage and the second power voltage below a preset value.

2. The power circuit according to claim 1, wherein the first element is turned on when the difference between the first power voltage and the second power voltage is equal to or greater than the preset value and turned off when the difference is less than the preset value.

3. The power circuit according to claim 1, wherein the first element comprises a diode including an anode coupled to the sensed power voltage and a cathode coupled to the second power voltage.

4. The power circuit according to claim 1, wherein the at least one power detector comprises:
   a second element configured to selectively transfer the first power voltage;
   a third element configured to maintain a level of the first power voltage transferred by the second element; and
   a fourth element configured to transfer the sensed power voltage, maintained or changed by the first and third elements, to the comparator in response to a sensing signal.

5. The power circuit according to claim 4,
   wherein the sensing signal is input to the at least one power detector and the comparator, and
   wherein the comparator outputs the power sensing result while the sensing signal is activated.

6. The power circuit according to claim 5, wherein the at least one power detector comprises N power detectors, the sensing signal includes plural sensing signals, the plural sensing signals are individually input to the N power detectors, and the comparator outputs the power sensing result when one of the plural sensing signals is activated.

7. The power circuit according to claim 6, further comprising at least one switch configured to couple each of the N power detectors to the comparator.

8. A semiconductor device, comprising:
   plural pins or pads coupled to a first power voltage input from an external device;
   a power circuit coupled to the plural pins or pads and configured to output a second power voltage; and
   plural internal circuits coupled to the power circuit and configured to use the second power voltage to store or process a data item,
   wherein the power circuit comprises:
   plural power detectors individually coupled to one of the plural pins or pads and individually configured to output a sensed power voltage changed from the first power voltage in response to a drop of the second power voltage; and
   a comparator configured to compare the sensed power voltage, output from one of the plural power detectors, with a reference voltage to output a power sensing result.

9. The semiconductor device according to claim 8, wherein the power circuit further comprises a low drop-out (LDO) regulator configured to receive the first power voltage and output the second power voltage having the lowest input/output voltage difference capable of stabilizing an operation performed by the plural internal circuits.

10. The semiconductor device according to claim 8, wherein the power circuit further comprises plural switches configured to couple each of the plural power detectors to the comparator.

11. The semiconductor device according to claim 8, wherein each of the plural power detectors comprises a first element configured to receive the first power voltage, output the second power voltage, and maintain a difference between the first power voltage and the second power voltage below a preset value.

12. The semiconductor device according to claim 11, wherein the first element is turned on when the difference between the first power voltage and the second power voltage is equal to or greater than the preset value and turned off when the difference is less than the preset value.

13. The semiconductor device according to claim 12, wherein the first element comprises a diode including an anode coupled to the sensed power voltage and a cathode coupled to the second power voltage.

14. The semiconductor device according to claim 11, wherein each of the plural power detectors comprises:
   a second element configured to selectively transfer the first power voltage;
   a third element configured to maintain a level of the first power voltage transferred by the second element; and
   a fourth element configured to transfer the sensed power voltage, maintained or changed by the first and third elements, to the comparator in response to a sensing signal.

15. The semiconductor device according to claim 8, wherein each of plural sensing signals is input to each of the plural power detectors and the comparator, and
   wherein, while one of the plural sensing signals is activated, the comparator outputs the power sensing result corresponding to the activated sensing signal.

16. The semiconductor device according to claim 15, wherein, when one of the plural sensing signals is activated, the comparator compares the sensed power voltage, output from one of the plural power detectors in response to the activated sensing signal, with a reference voltage to output the power sensing result.

17. A power sensing circuit which is coupled to a first power voltage input from an external device via plural pins or pads and coupled to a second power voltage supplied to an internal circuit, and configured to, when a change of the second power voltage occurs, compare the first power voltage which is changed based on the change of the second power voltage, with a reference voltage to output a power sensing result, wherein the power sensing circuit detects the change of the second power voltage without affecting a level of the second power voltage,
   wherein the power sensing circuit comprises a diode including an anode coupled to the first power voltage and a cathode coupled to the second power voltage, and configured to maintain a difference between the first power voltage and the second power voltage below a preset value.

18. The power sensing circuit according to claim 17, wherein the diode is turned on when the difference between the first power voltage and the second power voltage is equal to or greater than the preset value and turned off when the difference is less than the preset value.

\* \* \* \* \*